United States Patent
Ibbetson

(10) Patent No.: US 8,288,942 B2
(45) Date of Patent: Oct. 16, 2012

(54) HIGH EFFICACY WHITE LED

(75) Inventor: James Ibbetson, Santa Barbara, CA (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 11/227,667

(22) Filed: Sep. 15, 2005

(65) Prior Publication Data

US 2006/0138937 A1  Jun. 29, 2006

Related U.S. Application Data

(60) Provisional application No. 60/683,027, filed on May 20, 2005, provisional application No. 60/639,705, filed on Dec. 28, 2004.

(51) Int. Cl.
*H01L 33/00* (2010.01)
(52) U.S. Cl. .......... 313/512; 313/502; 313/511; 257/40; 257/296
(58) Field of Classification Search .......... 313/498–512; 257/40, 72, 98–100, 642–643, 759
See application file for complete search history.

(56) References Cited

U.S. PATENT DOCUMENTS

| | | | |
|---|---|---|---|
| 2,001,622 A | 5/1935 | McCaa | |
| 3,684,930 A * | 8/1972 | Collins et al. | 257/99 |
| 3,760,237 A * | 9/1973 | Jaffe | 257/98 |
| 3,805,347 A * | 4/1974 | Collins et al. | 445/24 |
| 4,703,219 A | 10/1987 | Mesquida | |
| 4,902,356 A | 2/1990 | Noguchi et al. | |
| 4,912,532 A | 3/1990 | Cook et al. | |
| 5,103,271 A | 4/1992 | Izumiya et al. | |
| 5,376,580 A | 12/1994 | Kish et al. | |
| 5,416,342 A | 5/1995 | Edmond et al. | |
| 5,502,316 A | 3/1996 | Kish et al. | |
| 5,739,554 A | 4/1998 | Edmond et al. | |
| 5,838,706 A | 11/1998 | Edmond et al. | |
| 5,912,477 A | 6/1999 | Negley | |
| 5,985,687 A | 11/1999 | Bowers et al. | |
| 6,071,795 A | 6/2000 | Cheung et al. | |
| 6,100,104 A | 8/2000 | Haerle et al. | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,234,645 B1 * | 5/2001 | Borner et al. | 362/231 |

(Continued)

FOREIGN PATENT DOCUMENTS

EP   1 263 058 A   12/2002

(Continued)

OTHER PUBLICATIONS

Zukauskas et al., Optimization of multchip white solid-state lighting source with four or more LEDs, Solid State Lighting and Displays Proceedings of SPIE, vol. 4445, 2001.*

(Continued)

*Primary Examiner* — Tracie Y Green
(74) *Attorney, Agent, or Firm* — Koppel, Patrick, Heybl & Philpott

(57) ABSTRACT

A white light emitting solid-state lamp is disclosed having an output of at least 75 lumens per watt at 20 milliamps drive current. The lamp includes a light emitting diode, an encapsulant, and a header. The diode includes a conductive silicon carbide substrate for electrical contact and a Group III nitride active portion on the silicon carbide substrate for generating desired frequency photons under the application of current across the diode. The header includes a reflective cup for supporting the diode and for providing electrical contact to the diode and to the active portion. The encapsulant includes a phosphor, present in at least portions of the encapsulant for generating responsive frequencies when the phosphor is excited by the frequencies emitted by the diode.

27 Claims, 6 Drawing Sheets

U.S. PATENT DOCUMENTS

| | | | |
|---|---|---|---|
| 6,252,254 B1 * | 6/2001 | Soules et al. ............... 257/89 |
| 6,258,699 B1 | 7/2001 | Chang et al. |
| 6,303,405 B1 | 10/2001 | Yoshida et al. |
| 6,335,263 B1 | 1/2002 | Cheung et al. |
| 6,365,429 B1 | 4/2002 | Kneissl et al. |
| 6,373,077 B1 | 4/2002 | Edmond et al. |
| 6,403,985 B1 | 6/2002 | Fan et al. |
| 6,410,940 B1 | 6/2002 | Jiang et al. |
| 6,410,942 B1 | 6/2002 | Thibeault et al. |
| 6,420,199 B1 | 7/2002 | Coman et al. |
| 6,420,242 B1 | 7/2002 | Cheung et al. |
| 6,448,102 B1 | 9/2002 | Kneissl et al. |
| 6,459,100 B1 | 10/2002 | Doverspike et al. |
| 6,465,809 B1 | 10/2002 | Furukawa et al. |
| 6,468,824 B2 | 10/2002 | Chen et al. |
| 6,522,063 B2 * | 2/2003 | Chen et al. ............... 313/498 |
| 6,559,075 B1 | 5/2003 | Kelly et al. |
| 6,562,648 B1 | 5/2003 | Wong et al. |
| 6,600,175 B1 * | 7/2003 | Baretz et al. ............... 257/100 |
| 6,607,931 B2 | 8/2003 | Streubel |
| 6,610,551 B1 | 8/2003 | Doverspike et al. |
| 6,635,503 B2 | 10/2003 | Andrews et al. |
| 6,642,072 B2 * | 11/2003 | Inoue et al. ............... 438/26 |
| 6,649,437 B1 | 11/2003 | Yang et al. |
| 6,657,236 B1 | 12/2003 | Thibeault et al. |
| 6,664,560 B2 | 12/2003 | Emerson et al. |
| 6,677,173 B2 | 1/2004 | Ota |
| 6,716,654 B2 | 4/2004 | Hsu et al. |
| 6,734,033 B2 | 5/2004 | Emerson et al. |
| 6,740,604 B2 | 5/2004 | Kelly et al. |
| 6,740,906 B2 | 5/2004 | Slater, Jr. et al. |
| 6,747,298 B2 | 6/2004 | Slater, Jr. et al. |
| 6,757,314 B2 | 6/2004 | Kneissl et al. |
| 6,786,390 B2 | 9/2004 | Yang et al. |
| 6,791,119 B2 * | 9/2004 | Slater et al. ............... 257/99 |
| 6,800,500 B2 | 10/2004 | Coman et al. |
| 6,800,876 B2 | 10/2004 | Edmond et al. |
| 6,806,112 B1 | 10/2004 | Horng et al. |
| 6,809,341 B2 | 10/2004 | Hsu et al. |
| 6,815,312 B2 | 11/2004 | Furukawa et al. |
| 6,821,804 B2 | 11/2004 | Thibeault et al. |
| 6,825,501 B2 | 11/2004 | Edmond et al. |
| 6,846,686 B2 | 1/2005 | Saeki et al. |
| 6,849,878 B2 | 2/2005 | Bader et al. |
| 6,869,813 B2 | 3/2005 | Okazaki |
| 7,217,957 B2 * | 5/2007 | Kuhara et al. ............... 257/98 |
| 2002/0022290 A1 | 2/2002 | Kong et al. |
| 2002/0028527 A1 * | 3/2002 | Maeda et al. ............... 438/29 |
| 2002/0068373 A1 | 6/2002 | Lo et al. |
| 2002/0121642 A1 * | 9/2002 | Doverspike et al. ............... 257/97 |
| 2002/0123164 A1 * | 9/2002 | Slater et al. ............... 438/39 |
| 2002/0197764 A1 | 12/2002 | Uemura et al. |
| 2003/0015721 A1 | 1/2003 | Slater et al. |
| 2003/0020084 A1 * | 1/2003 | Fan et al. ............... 257/92 |
| 2003/0045015 A1 | 3/2003 | Slater, Jr. et al. |
| 2003/0132701 A1 | 7/2003 | Sato et al. |
| 2003/0173602 A1 | 9/2003 | Hsu et al. |
| 2003/0197170 A1 | 10/2003 | Bader et al. |
| 2004/0004226 A1 | 1/2004 | Eisert et al. |
| 2004/0012027 A1 | 1/2004 | Keller et al. |
| 2004/0031978 A1 * | 2/2004 | D'Evelyn et al. ............... 257/233 |
| 2004/0033638 A1 | 2/2004 | Bader et al. |
| 2004/0056260 A1 | 3/2004 | Slater, Jr. |
| 2004/0072382 A1 | 4/2004 | Kelly et al. |
| 2004/0124429 A1 * | 7/2004 | Stokes et al. ............... 257/98 |
| 2004/0135158 A1 | 7/2004 | Hon |
| 2004/0217360 A1 | 11/2004 | Negley |
| 2005/0006669 A1 | 1/2005 | Mishra et al. |
| 2005/0173692 A1 * | 8/2005 | Park et al. ............... 257/13 |
| 2006/0012299 A1 * | 1/2006 | Suehiro et al. ............... 313/512 |
| 2006/0060877 A1 * | 3/2006 | Edmond et al. ............... 257/99 |
| 2008/0017875 A1 * | 1/2008 | Lee et al. ............... 257/98 |

FOREIGN PATENT DOCUMENTS

| | | |
|---|---|---|
| JP | 61059886 | 3/1986 |
| JP | 11238913 | 8/1999 |
| JP | 2002-368267 | 12/2002 |
| JP | 2004-521494 | 7/2004 |
| JP | 2004521494 | 7/2004 |
| JP | 2011-101568 | 9/2011 |

OTHER PUBLICATIONS

SMT LEDs Ideally suited for New Generation, Solid-State Lighting Solutions Mar. 31, 2004, Business Wire.*

Bulman, G.E., et al ; "Nitride Lasers on SiC Substrates," Lasers and Electro-Optics Annual Meeting, ISBN 0-7803-4947-4, IEEE, Dec. 1, 1998, vol. 2, pp. 348-349.

Windisch R, et al; "40% Efficient Thin-Film Surface-Textured Light-Emitting Dios by Optimization of Natural Lithography," IEEE Transactions on Electron Devices, ISSN: 0018-9383, vol. 47 No. 7, Jul. 2000, pp. 1492-1498.

Nakamura S, et al; "Superbright Green Ingan Single-Quantum-Well-Structure Light-Emitting Diodes," Japanese Journal of Applied Physics, ISSN: 0021-4922, vol. 34., No. 10B, Part 2, Oct. 15, 1995, pp. L1332-L1335.

Harle et al., Advanced Technologies for High Efficiency GaInN LEDs for Solid State Lighting, Third Intl. Conference on Solid State Lighting, Proc. of SPIE, vol. 5187, 2004.

Koike et al., Development of High Efficency GaN-based Multiquantum-Well Light Emitting Diodes and their Applications. IEEE, vol. 8 No. 2, Mar.-Apr. 2002.

Kuo et al.. Nitride-based Near-Ultraviolet LEDs with an ITO Transparent Contact, Materials Science and Engineerng, vol. B106, pp. 69-72, 2004.

Gardner et al., High-Flux and High Efficiency Nitride-Based Light Emitting Diodes, IEEE, pp. 641-642, 2002.

Craford, M. George, Visible LEDs: The Trend Toward High Power Emitters and Remaining Challenges for Solid State Lighting, Solid State Lighting II, Proc. of SPIE, vol. 4776, 2002.

Niki et al., White LEDs for Solid State Lighting, Third International Conference on Solid State Lighting, Proc. of SPIE. vol. 5187, 2004.

Tadamoto et al., High Output Power Near-Ultraviolet and Violet Light-Emitting Diodes Fabricated on Patterned Sapphire Substrates Using Metalorganic Vapor Phase Epitaxy, Third Intl. Conference on Solid State Lighting, Proc of SPIE, vol. 5187, 2004.

Mukai et al., Recent Progress of Nitride-Based Light Emitting Devices, Phys. Stat. Sol. vol. 200, No. 1, pp. 52-57, 2003.

Mukai et al., GaN-based Light-Emitting Diodes Suitable for White Light, Light Emitting Diodes: Research, Manufacturing, and Applications VII, Proc. of SPIE, vol. 4996, 2003.

Morita et al., Over 200 mW on 365 nm Ultraviolet Light Emitting Diode of GaN-free Structure, Phys. Stat. Sol., vol. 200. No. 1, pp. 114-117, 2003.

United Epitaxy Company, Ltd., Specifications Confirmation Letter, 4713DC AlInGaN Blue LED Chip, 2003.

Labsphere, The Radiometry of Light Emitting Diodes-Technical Guide.

Epitech Technology Corporation, Traffic Green LED Chip, Dec. 2003.

Seoul Semiconductor Co. Ltd., AlInGaN LED DICE, 2003.

Epitech Technology Corporation, Near Blue LED Chip, Dec. 2003.

Unity Opto Technology Co., Ltd., AlGaAs/GaAs High Power T-1 3/4 Package Infrared Emitting Diode, Nov. 17, 2000.

Nichia Corporation, White Led Analysis, Mar. 17, 2004.

Instrument Systems, LED Station, MAS 40 Turn-key System for LED Testing.

German Patent Application No. 11 2005 003 581.6, First Official Communication dated Dec. 15, 2009.

Decision of Rejection for counterpart Japanese Patent Application No. 2008-512259 dated May 23, 2011.

Decision of Dismissal of Amendment for counterpart Japanese Patent Application No. 2008-512259 dated May 23, 2011.

Notice of Reason for Rejection in Japanese Patent Application No. 2011-101568 dated Apr. 3, 2012.

Interrogation from Japanese Patent Application No. 2008-512259, dated Apr. 24, 2012.

"OSRAM Opto Semiconductors Spotlights New Generation of LED's Based on Thin-Film Technology at Lightfair International 2004". Business wire. New York, Mar. 31, 2004, p. 1.

* cited by examiner

HIGH EFFICACY WHITE LED

This application claims priority from provisional application Ser. No. 60/683,027 filed May 20, 2005. This application is related to the following copending and commonly assigned U.S. application Ser. No. 10/951,042 filed Sep. 22, 2004 for, "High Efficiency Group III Nitride Silicon Carbide Light Emitting Diode;" Ser. No. 10/811,350 filed on Mar. 26, 2004 for, "Etching of Substrates of Light Emitting Devices;" Ser. No. 60/591,353 filed on Jul. 27, 2004 for, "Ultra-Thin Ohmic Contacts for P-Type Nitride Light Emitting Devices;" and Ser. No. 60/639,705 filed Dec. 28, 2004 for, "Ultra-Thin Ohmic Contacts for P-Type Nitride Light Emitting Devices." The contents of each of these are incorporated entirely herein by reference.

BACKGROUND

The present invention relates to artificial illumination, and in particular relates to solid state lamps that produce white light.

Artificial lighting for illumination purposes is incorporated in a wide variety of environments. Major categories include office lighting, home lighting, outdoor lighting for various purposes, signage, indicators, and many others. In the age of modern electricity, the common forms of artificial lighting include (but are not limited to) incandescent, halogen vapor, and fluorescent. All of these have particular advantages and disadvantages, but in certain aspects and they all use relatively large amounts of electricity compared to their light output, and all tend to have obviously finite lifetimes. In particular, the incandescent lamp has been in use in its present form for almost a century, making it one of the longest lived of modern inventions to remain in an early form. In comparison most other early electronic technologies have been replaced by digital electronic counterparts.

The semiconductor era has witnessed the replacement of many types of electrical devices with solid state counterparts. The most obvious is perhaps the replacement of the vacuum tube (almost unknown to present younger generations) with the transistor. Solid state devices, because of their nature and operation, are inherently much more reliable than earlier generations of electronic devices and can have significantly longer lifetimes, typically by a factor of at least 100.

Furthermore, some solid-state devices emit light in operation. The most common is the light emitting diode (LED) in which current is injected across a p-n junction to drive the recombination of electrons and holes with the concurrent production of photons. Depending upon the semiconductor materials from which the diode is formed, and particularly depending upon the bandgap of those materials, different frequencies of light are emitted and are characteristic of the material. For example, gallium arsenide phosphide (GaAsP) represents a well-established material system for light emitting diodes. Depending on the mole fraction of Ga and As, these materials have a bandgap of between about 1.42 and 1.98 electron volts (eV), and will emit light in the infrared, red and orange portions of the electromagnetic spectrum.

In comparison, materials such as silicon carbide (SiC), gallium nitride (GaN), or the related Group III nitride compounds, have wider bandgaps of about 3.0 and about 3.5 eV respectively, and thus generate photons of higher frequency in the blue, violet, and ultraviolet portions of the spectrum.

Because of their reliability, efficiency and relatively low power demands, solid-state light-emitting devices have gained wide acceptance for a number of applications. Because the devices are relatively small, however, and comparatively less bright than more conventional alternatives (incandescent, florescent) their greatest use has been as indicators and other low brightness applications rather than for illumination.

Additionally, some of the LED properties that are favorable in many circumstances (e.g., emission along a narrow band of wavelengths), tend to make LEDs initially less attractive for illumination purposes. For example, LEDs cast only a narrow range of wavelengths. In many circumstances—often because much of color perception depends upon the illumination frequencies—this compares unfavorably with natural light, or even incandescent or florescent light which, because of some of their inherent limitations, actually cast light across a wider range of frequencies than do LEDs.

Two types of technology are used to produce white light from light emitting diodes. In a first, blue light emitting diodes are combined with both red and green light emitting diodes to produce the desired full colors of the visible spectrum, including white light. In the second, higher frequency emitting diodes (e.g., in the ultraviolet, violet and blue range) are used in conjunction with phosphors (typically yellow-emitting) to emit a combination of direct blue light from the diode and yellow light from the phosphor that in combination give white light from the lamp.

The efficiency of a light emitting diode can be characterized in numerous manners, but in general is dependent upon several factors which in practice become cumulative in their positive or negative aspects. For example, for any given amount of current injected into a light emitting diode, some fraction less than 100% of the injected carriers (electrons or holes) will actually recombine. Of those that recombine, another fraction less than 100% will generate photons. Of the photons created, yet another fraction less than 100% will actually be extracted; i.e., leave the diode as visible light. When a phosphor is incorporated, the efficiency is moderated yet again by the conversion efficiency of the phosphor.

Based upon these and other factors, full spectrum light emitting diode devices have the potential to completely replace both incandescent and fluorescent lighting, and inexpensive, readily-manufactured solid-state lamps that emit white light remain a major goal of both researchers and manufacturers.

Accordingly, increasing the desired output of a white light emitting diode for illumination purposes requires increasing one or more of the injection efficiency, the percentage of radiative recombinations, and the amount of photons extracted. Thus, producing brighter total output at relative power levels and across a wider range of the visible spectrum to produce more pleasing effects when in use remains another continuing goal.

SUMMARY

In one aspect the invention is a high efficiency high output white light emitting solid-state lamp with an output of at least 75 lumens per watt at 20 milliamps drive current. In this aspect the invention includes a light emitting diode, an encapsulant, and a header. The diode includes a conductive silicon carbide substrate for electrical contact and a Group III nitride active portion on the silicon carbide substrate for generating desired frequency photons under the application of current across the diode. The header includes a reflective cup for supporting the diode and for providing electrical contact to the diode and to the active portion. The encapsulant includes a phosphor, present in at least portions of the encapsulant for generating responsive frequencies when the phosphor is excited by the frequencies emitted by the diode.

In another aspect the invention is a packaged light emitting diode lamp that demonstrates at least 57 lumen per watt of white light at an operating current of 350 milliamps. The lamp includes a conductive header and a light emitting diode on the header. The diode includes a silicon carbide substrate, at least one active layer of indium gallium nitride, ohmic contacts in a vertical orientation with respect to said substrate and said active layer, and with the ohmic contact to the active layer being in electrical contact with the header. An encapsulant covers the diode and at least portions of the header. A phosphor in the encapsulant emits visible light in response to the emission from said diode.

In another aspect the invention is a packaged light emitting diode lamp that demonstrates at least 142 lumen per watt of white light at an operating current of 1 amp.

In another aspect, the invention is a white light emitting diode-based lamp that includes a light emitting diode that emits in a portion of the spectrum selected from the ultraviolet, blue, and violet portions of the electromagnetic spectrum. A dimpled header supports the diode, the dimple having a shape that maximizes the extraction of light from the diode in the dimple. A first portion of an encapsulating resin covers the diode in the dimple but does not fill the remainder of the dimple. A second portion formed of a mixture of the encapsulating resin with a phosphor fills the remainder of the dimple to thereby separate the phosphor containing portion sufficiently from the diode to prevent the diode from absorbing light from the phosphor that can otherwise be extracted. A lens is on the filled dimple and formed of the encapsulating resin for increasing and maximizing the extraction of light from the lamp.

In another aspect the invention is a method of forming a high efficiency white emitting semiconductor-based lamp. In this aspect the method includes the steps of forming a cup-shaped dimple into a header base for providing electrical contact and a reflective background and structure, positioning a high frequency light emitting diode in the dimple and electrically connecting the diode to an isolated lead, partially filling the dimple cup with a sufficient encapsulation material to cover the chip without filling the cup, curing the partially filled encapsulation material, filling the remainder of the cup with a mixture of the encapsulation material and a phosphor responsive to the frequency produced by the diode to thereby separate the phosphor from direct contact with the diode to thereby minimize the diode's absorption of phosphorescent light, curing the remaining encapsulation material in the cup, forming a solid lens of encapsulation material on the cured material in the cup to enhance the extraction of light from the diode, and curing the lens material to form the finished lamp.

The foregoing and other objects and advantages of the invention and the manner in which the same are accomplished will become clearer based on the followed detailed description taken in conjunction with the accompanying drawings.

DETAILED DESCRIPTION

The present invention is a high efficiency white light emitting solid-state lamp. Lamps according to the invention are characterized by an output of at least 75 lumens per watt (W) at 20 milliamps (mA) drive current.

The units of measurement reported herein are conventional and well understood. Thus, the luminous flux measurements are photometry units and are measured in lumens. The corresponding, although not identical radiometry measurement is the radiant flux measured in watts. The efficiency is expressed herein as the luminous flux per watt, based upon the current across the diode, most frequently expressed herein in milliamps.

The term "external quantum efficiency" is used to describe the ratio of emitted light intensity to current flow (e.g., photons out/electrons in). Photons can be lost through absorption within the semiconductor material itself, through reflection losses when light passes from the semiconductor to air because of the differences in refractive index, and from the total internal refraction of light at angles greater than the critical angle defined by Snell's law. Accordingly, the external quantum efficiency (EQE) as a percentage can be calculated from the radiant flux (Watts), the wavelength (nanometers), the drive current (amps) and the conversion factor between wavelength and energy ($\lambda=1.24/eV$) according to the following formula:

$$EQE\ (\%) = \frac{(\text{radiant flux}) \times (\text{wavelength})}{(1240) \times (\text{drive current})} \times 100$$

A useful short summary of these and other technical factors relating to light emitting diodes and lamps is set forth in the Labsphere Technical Guide, "The Radiometry of Light Emitting Diodes," from Labsphere, Inc. North Sutton N.H.

In a first embodiment, the lamp includes a light emitting diode (also referred to as the "die" or the "chip"), an encapsulant, and a header. The diode includes a conductive silicon carbide substrate for electrical contact and a Group III nitride active portion on the silicon carbide substrate for generating desired frequency photons under the application of current across the diode.

The header includes a reflective cup for supporting the diode and for providing electrical contact to the diode and to the active portion.

At least portions of the encapsulant include a phosphor for generating responsive frequencies in the visible spectrum when the phosphor is excited by the frequencies emitted by the diode.

Figure 1:
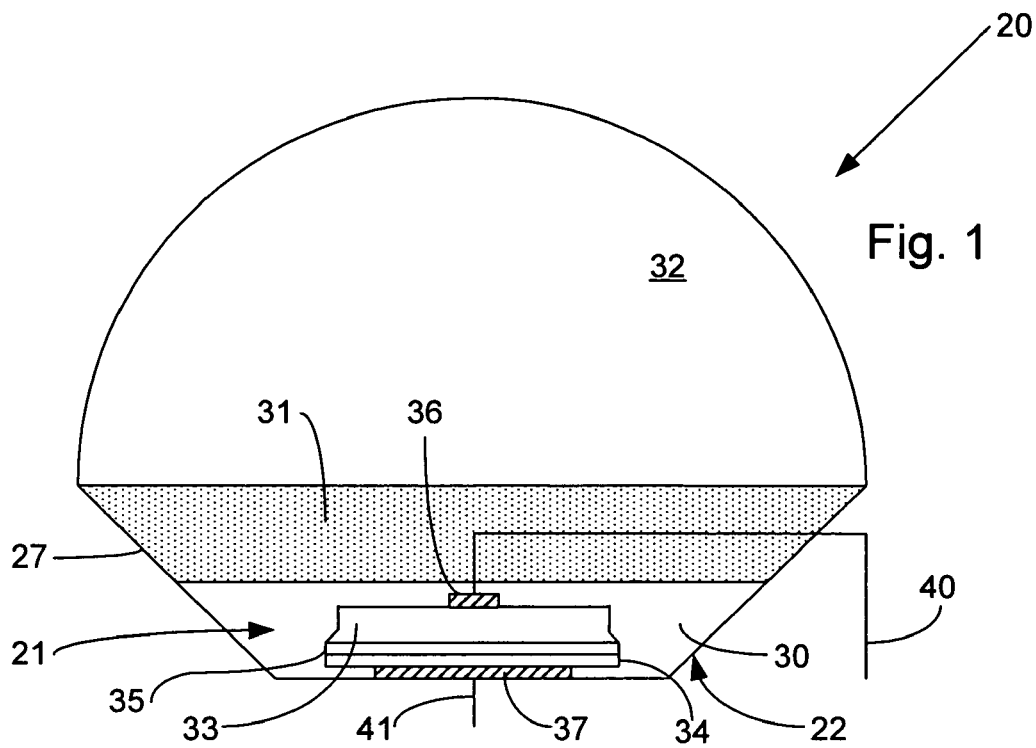
FIG. 1 is a schematic cross-sectional view of a portion of a lamp according to the present invention.
Figure 2:
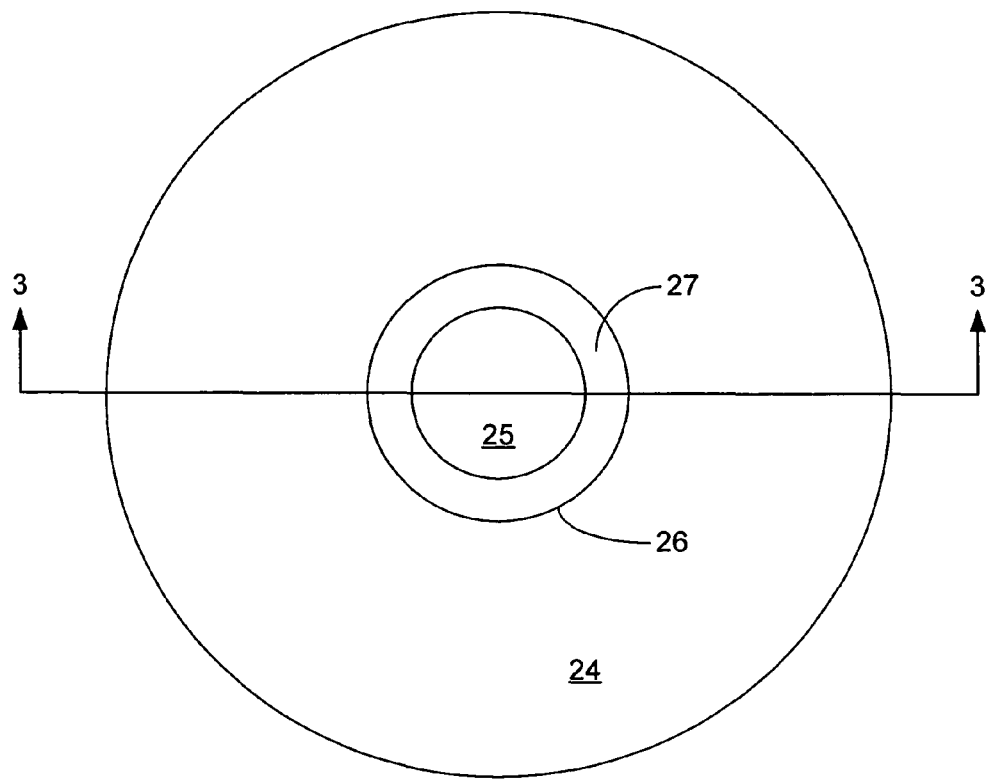
FIG. 2 is a top plan view of a die cup for diode lamps according to the present invention.
Figure 3:
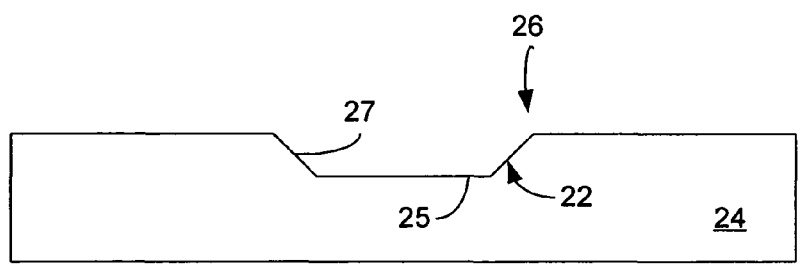
FIG. 3 is a cross-sectional view taken along lines 3-3 of FIG. 2.

FIG. 1 is a schematic diagram illustrating some of these features. In FIG. 1 the diode is broadly designated at 20. The light emitting diode is broadly designated at 21 and is positioned in a dimple (or cup) 22 in a header 24 that is best illustrated in FIG. 3. FIG. 2 illustrates these elements in top plan orientation. The dimple 22 has a functional shape that maximizes the extraction of light from the diode 21. In preferred embodiments, the dimple 22 has a frustoconical shape; i.e. a circular floor facing a parallel and larger circular opening 26 with slanted walls 27 between the opening 26 and the floor 25. The exact angle of the wall 27 can be selected and designed for maximum extraction of light from individual chip designs, but in the invention the walls are most preferably oriented at angles of between about 45 and 60 degrees with respect to the floor 25. In preferred embodiments, the dimpled cup 22 is coated with a reflective metal, most preferably silver (Ag).

In the embodiment of the invention illustrated in FIG. 1, the encapsulant has three portions. The first portion of the encapsulant, typically an epoxy resin, is indicated at 30 and fills some, but not all, of the cup 22. Specifically, the first portion covers and extends above the diode 21. A second portion of the encapsulant 31 is formed of a mixture of a resin (usually the same resin, for optical purposes) with a phosphor. This second portion fills the remainder of the cup 22 to thereby separate the phosphor containing portion 31 sufficiently from the diode 21 to minimize the amount of phosphor-emitted light absorbed into the diode (and therefore wasted).

Stated differently, with respect to emission from the phosphor, the diode is merely an obstacle to emitted light. Separating the diode from the phosphor minimizes this otherwise undesired effect.

A third portion of the encapsulant 32 forms a lens, in many cases in the shape of a hemisphere, on the filled cup 22 for maximizing and increasing the extraction of light from the lamp.

In certain embodiments of the invention, the lamp 20 can produce an output of at least 75 lumens per watt at 20 milliamps drive current, in some cases 80 lumens per watt at 20 milliamps drive current, and in some cases at least 85 lumens per watt at 20 milliamps drive current.

At other drive currents, diodes according to the invention have demonstrated at least 57 lumens per watt of white light at an operating current of 350 milliamps, and have also demonstrated at least 142 lumens per watt of white light at an operating current of 1 amp.

In addition to the structure of the encapsulant, the invention takes advantage of certain developments that are described in more detail in the patents, published applications, and co-pending applications that are referred to herein and that are incorporated by reference.

In preferred embodiments, the diode 21 is in the nature of, although not limited to, the XT290 and XB900 series of light emitting diodes available from Cree Inc. of Durham N.C., the assignee of the present invention. These diodes include a conductive silicon carbide substrate illustrated at 33 in FIG. 1, combined with at least one p-type Group III nitride layer 34 and at least one n-type Group III nitride layer 35, preferably InGaN. One ohmic contact 36 is made to the silicon carbide substrate 33 while another ohmic contact 37 is made to the appropriate Group III nitride layer.

The XT290 chip has a footprint of 300 by 300 microns (μm) with a thickness of about 115 μm. The XB900 chip is significantly larger, having a footprint of 900 by 900 μm and a thickness of about 250 μm. Accordingly, the XB900 chip represents more of a "power" design, although the use of this term is somewhat arbitrary. As between the two chips in commercial use, the larger size of the XB900 makes it an attractive candidate for general illumination, including task lighting, outdoor illumination and traffic colors, while the smaller size of the XT290 chip makes it useful for lower-voltage applications such as back lighting in cellular phones, digital cameras, dashboard lighting, and display lighting on audio and video devices.

From a performance standpoint the XB900 series can operate at a 400 milliamps forward current with a peak forward current of 500 milliamps, while the smaller XT290 chip has a maximum forward current rating of 30 milliamps and a peak forward current of 100 milliamps.

In the preferred embodiments, and consistent with the illustrative XT290 and XB900 series chips, the chip 21 is in a "flip-chip" orientation in which the substrate 33 faces upwardly (toward the lens 32) while the active layers 34 and 35 are adjacent the cup 22. As set forth in several of the incorporated references, this design can help increase light extraction. In preferred examples, and because of the characteristics of silicon carbide, the silicon carbide substrate is usually n-type as is the adjacent Group III nitride layer 35. The other Group III nitride layer 34 is thus p-type to form the p-n junction for injecting current and recombining carriers. When (as usual but not exclusively) the substrate is n-type, the p-type layer 34 is in contact with the ohmic contact 37 and then with the cup 22. Lead wires 40 and 41 are schematically included in the figures to show the means for an external connection with other devices or circuits.

It will be understood by those familiar with the detailed structure of light emitting diodes that terms such as "on" can describe structural elements (usually layers of semiconductors or metals) that are directly in contact with one another as well those that include an intermediate layer or structure that tends to enhance the overall function of the device. Thus, Group III nitride layers, although described herein is being "on" silicon carbide substrates, are often accompanied by buffer layers that enhance both the electronic and crystal structure transition between the substrate and the active layers. In a similar manner, the p-type layer of these diodes is typically formed in two parts, with one part being more suited for enhancing the ohmic contact between the semiconductor and the metal that forms the contact.

Additionally, although the fundamental structure of a light emitting diode is based on a p-type layer and an n-type layer, those familiar with this art will recognize that the layers can include plural arrangements such as multiple quantum wells and superlattice structures. For the sake of concisely describing the present invention, it will be understood that these features can be incorporated with the present invention, but will not be described in detail herein.

In more preferred embodiments, and as set forth in incorporated co-pending application Ser. No. 10/951,042, the diode 21 has a total dimension between and including the ohmic contacts 36 and 37 of no more than about 250 microns (μm). In further preferred embodiments, these dimensions are no more than 100 microns. These thin chips offer particular advantages in light extraction geometry for illumination purposes as well as for use in small displays such as cellular phones, digital cameras and personal digital assistants.

As a further method of reducing the size of the chip 21 and increasing the light extraction, the invention incorporates the thin ohmic contacts set forth in co-pending application 60/591,353 in which the ohmic contact preferably has an average thickness of between about one and 250 angstroms (Å) and most preferably between about one and 10 Å.

Because white light is a combination of other colors, and because the diodes used in the lamps of the present invention typically emit in the ultraviolet, violet or blue portions of the electromagnetic spectrum, the phosphor that is included in the second resin portion 31 is selected to emit responsive frequencies in the yellow portion of the visible spectrum when excited by emissions from the diode in the ultraviolet, violet or blue portions of the electromagnetic spectrum.

Cerium yttrium aluminum garnet ("Ce:YAG," $Y_3Al_5O_{12}$:$Ce^{+3}$) is an appropriate phosphor for this purpose. Other phosphors, including yellow/green emitting phosphors responsive to diodes useful in the present invention are set forth, by way of example and not limitation, in Paragraphs 51-69 and 74-75 of commonly assigned United States Patent Application Publication No. US 2004/0012027, the contents of which are incorporated entirely herein by reference.

The proportional amount of phosphor mixed with the encapsulant can be determined by those of ordinary skill in this art without undue experimentation. As generally recognized in this art, the goal is to maximize the amount of converted light, while concurrently minimizing the amount of light that is merely blocked by the phosphor. Appropriate amounts can be selected by those of ordinary skill in this art and without undue experimentation.

Additionally, the physical size of the phosphor particles can affect (advantageously or disadvantageously) the efficiency of both the phosphor's conversion of the light from the diode and the extraction of the phosphorescent light from the lamp package. In preferred embodiments of the invention, the size of the phosphor particles can be selected by those of skill in this art without undue experimentation, but were preferably in an average size range of between about 0.001 microns and 20 microns per particle.

If desired, the encapsulant can also include a scattering material, the nature and function of which is generally well understood in this art. A relevant explanation is set forth in previously incorporated Publication No. 20040012027 at Paragraphs 101 and 102.

Figure 8:
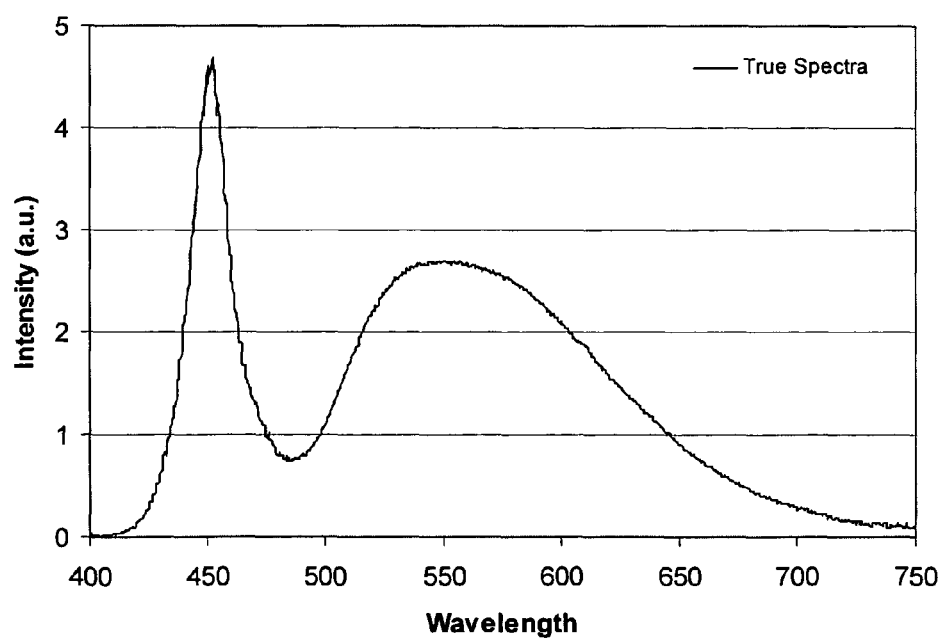
FIG. 8 is a plot of intensity versus wavelength for a lamp according to the present invention.

FIG. 8 is a spectrum taken from a diode according to the present invention and shows the diode's emission at about 455 nanometers (nm), along with a relatively broad range of emissions (about 490-700 nm) emitted by the phosphor.

FIGS. 2 and 3 illustrate the header 24 and the cup 25 in top plan and cross-sectional orientations. With particular reference to FIG. 3, and in exemplary embodiments, the diameter of the floor 25 is approximately 0.064 inch (0.163 cm), the diameter of the opening 26 is approximately 0.124 inch (0.315 cm), the depth of the cup 22 is approximately 0.030 inch (0.76 cm), and the walls 27 are oriented at a 45° angle. The outer dimensions of the header 24 are generally less important because the phosphor layer is maintained entirely within the cup 22. A T039 transistor-type header has, however, been found to be satisfactory for carrying the dimpled cup 22. In order to obtain proper orientation of the chip 21, the floor 25 should have a flatness of 0.001 and the tolerance of all dimensions should be within 0.005 inch (0.013 cm). Iron-nickel-cobalt alloys such as Kovar® are exemplary (but not limiting) materials for the header.

Figure 4:
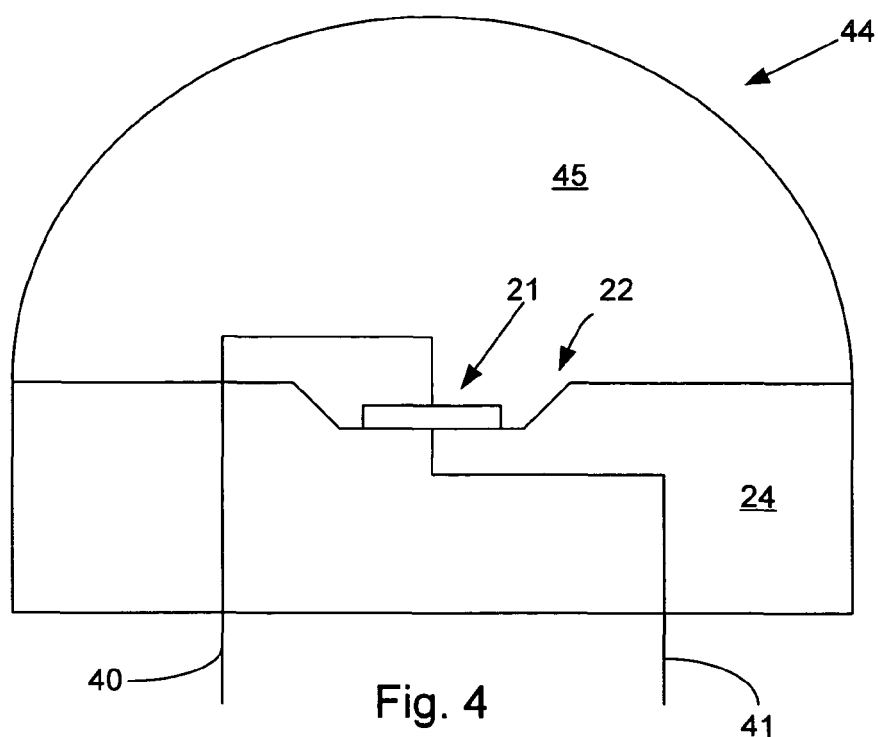
FIG. 4 is a cross-sectional schematic view of a slug-type lamp package according to the present invention.
Figure 5:
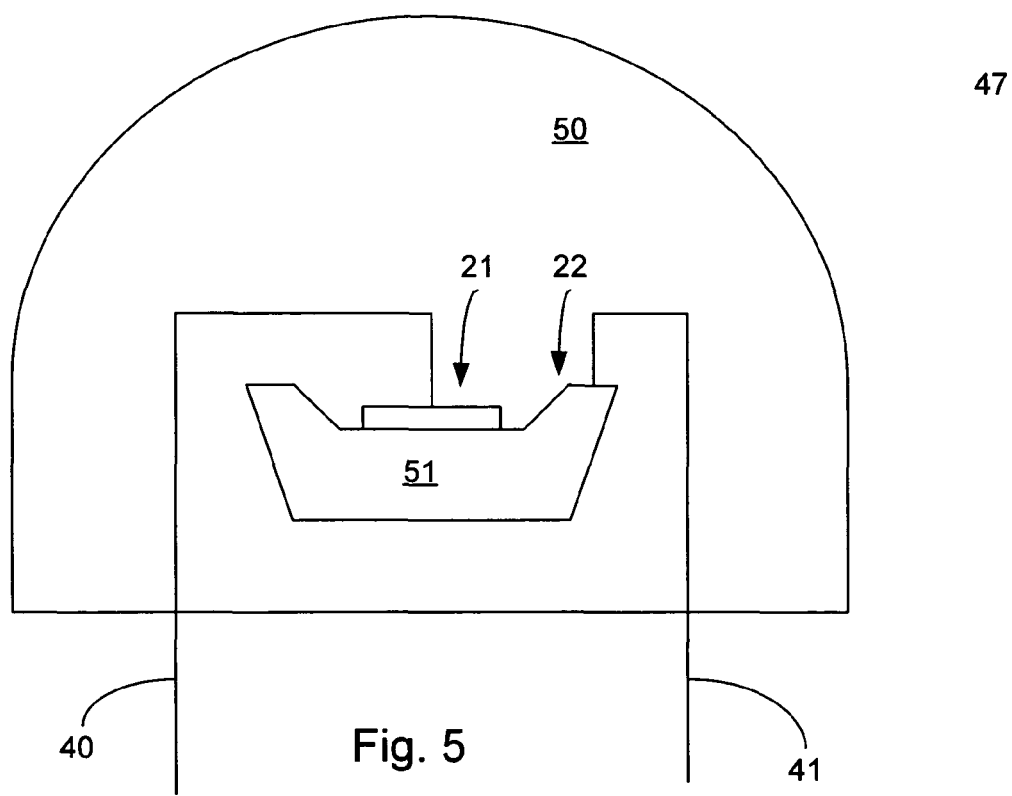
FIG. 5 is a cross-sectional schematic view of a cup-type package of a diode lamp according to the present invention.

FIGS. 4 and 5 are additional cross-sectional schematic views of lamps according to the present invention. FIG. 4 illustrates a slug type package broadly designated at 44. The encapsulant is shown as a single portion 45 although it will be understood that it forms the same three portions shown in more detail in FIG. 1. The diode is again broadly designated at 21, the cup is broadly designated at 22 and the header at 24. FIG. 4 also illustrates the lead wires 40 and 41.

FIG. 5 illustrates a cup-type package broadly designated at 47 with the encapsulant 50 completely surrounding the header cup which for distinguishing purposes is designated at 51. It will again be understood that the encapsulant 50 is formed of three portions, the first portion in the cup covering the diode 21, the second portion filling the remainder of the cop and being mixed with the phosphor, and the third portion that forms the lens. In a manner consistent with FIGS. 1 and 4, FIG. 5 also illustrates the electrical lead wires 40 and 41.

Figure 6:
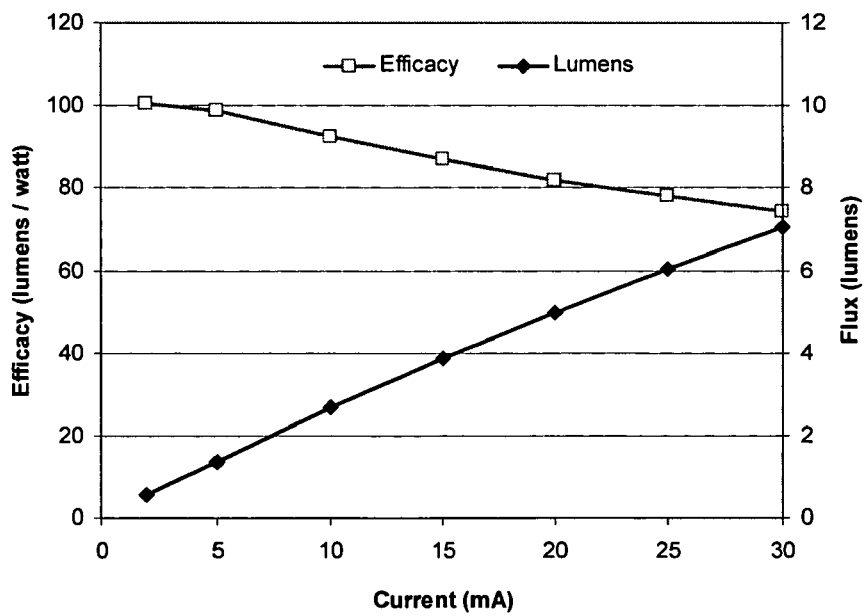
FIG. 6 is a combined plot of efficiency and flux as against current for a lamp according to the present invention.
Figure 7:
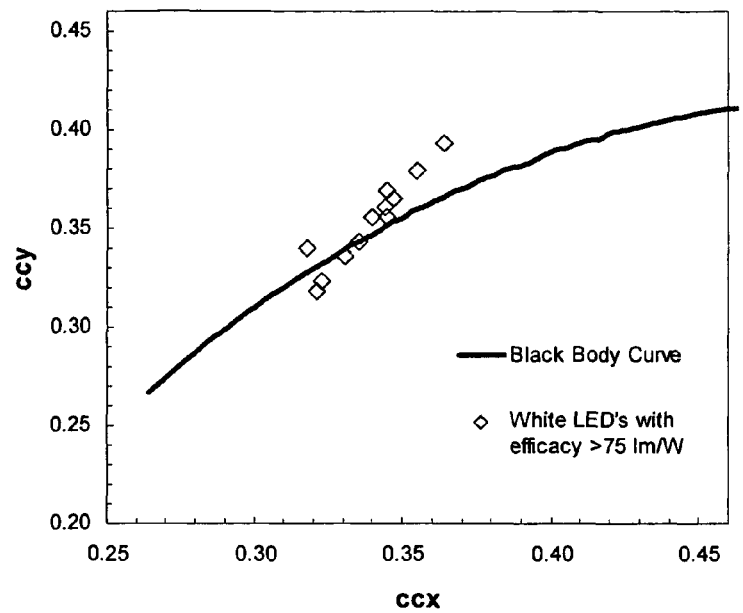
FIG. 7 is a plot of the CIE diagram color points of lamps according to the present invention with a black body curve superimposed.
Figure 9:
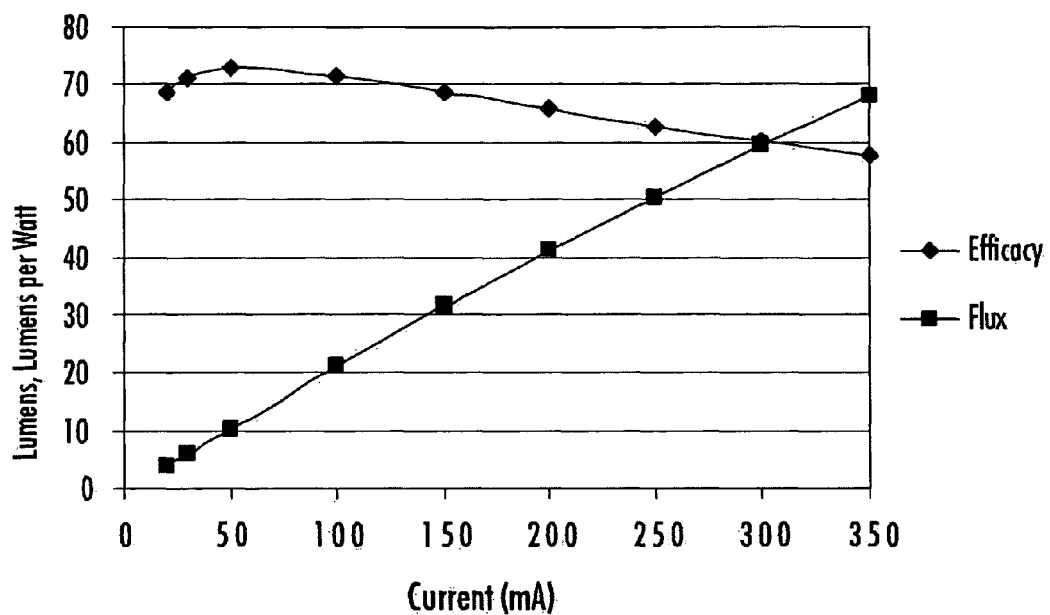
FIG. 9 is another plot of efficiency and flux plot against current for a lamp according to the present invention.
Figure 10:
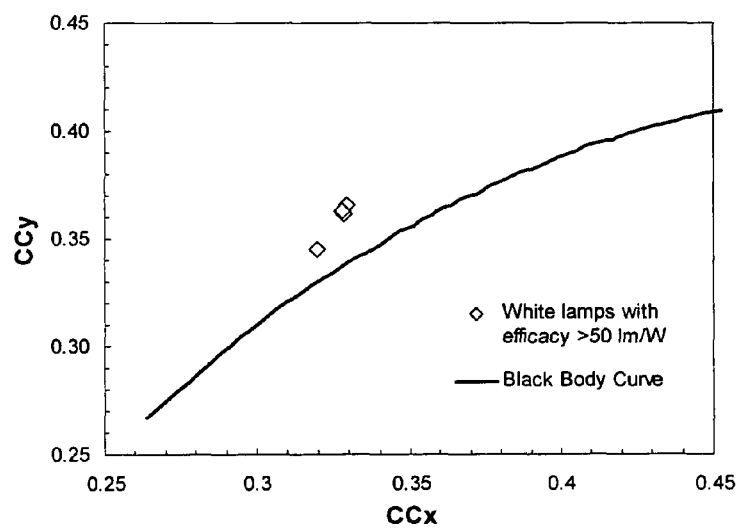
FIG. 10 is a plot of the CIE color points of another embodiment of the lamp according to the present invention.

FIGS. 6 through 10 illustrate some performance characteristics of the diodes and lamps according to the present invention. FIGS. 6, 7 and 8 plot data for high efficiency XT290-based white lamps according to the present invention, while FIGS. 9 and 10 plot similar data for the XB900-based white lamps according to the invention.

FIG. 6 plots two different ordinates against a common abscissa. The left ordinate plots efficacy (efficiency) in lumens per watt and is indicated by the open squares and connecting lines. The right ordinate plots the output flux measured as lumens and is indicated by the black diamonds and connecting lines. Because the respective lines are plotted against two different ordinates, the apparent convergence of the lines in FIG. 6 has no particular relevance.

Figure 11:
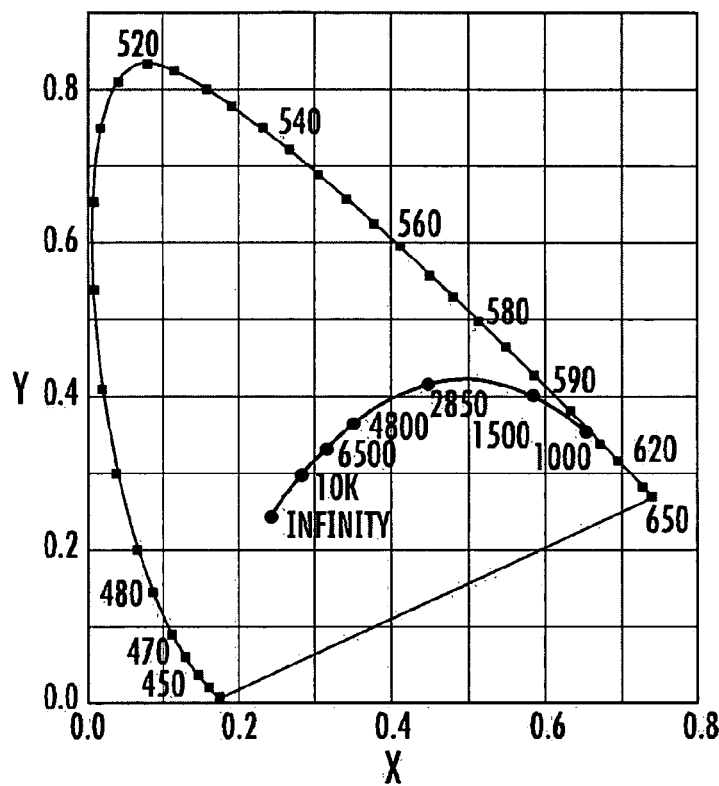
FIGS. 11 and 12 are respective version of the CIE diagram.
Figure 12:
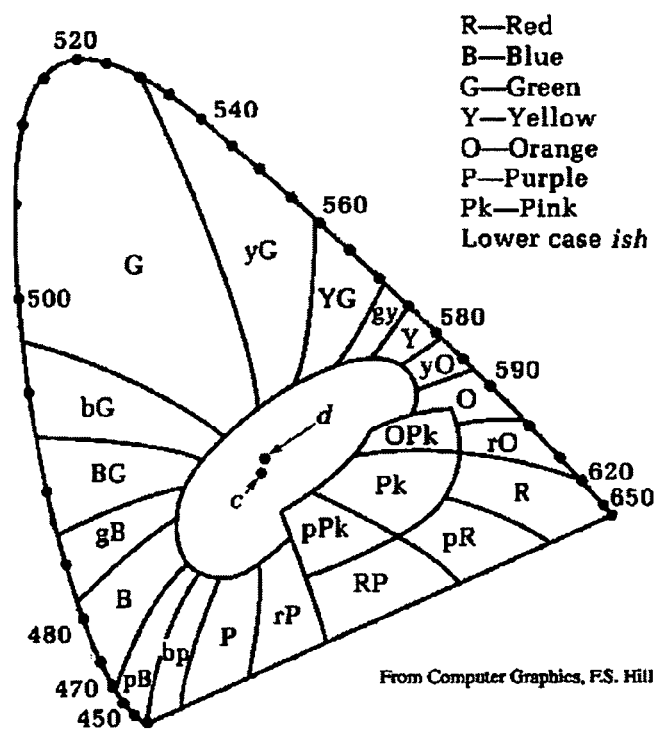

FIG. 7 is a plot of the emission of a plurality of white emitting lamps according to the present invention plotted using the x and y coordinates from the CIE color chart (FIGS. 11 and 12). All of the lamps had an efficiency of at least 75 lumens per watt and are shown in comparison to a black body curve.

As noted earlier, FIG. 8 is a plot of intensity in arbitrary units plot against wavelength in nanometers (nm) for a lamp according to the present invention. FIG. 8 illustrates the characteristic sharp emission of the diode at 455 nanometers and the broader emission of the phosphor over a range of frequencies of between about 500 and 700 nm.

FIG. 9 is a plot similar to FIG. 6 except taken from lamps using the XB900 diodes. FIG. 9 plots lumens (the dark squares) and lumens per watt (the black diamonds) on the same axis, again by coincidence. Thus, the intersection of the two plots is again coincidental.

FIG. 10 is a plot similar to FIG. 7, except using the larger footprint XB900 diodes. FIG. 10 again compares the output of the white light from lamps according to the invention in terms of CIE coordinates and in comparison to a black body curve.

FIGS. 11 (Luminal Path Corporation, www.photo.net) and 12 (Computer Graphics, FS Hill) are representative versions of the CIE color chart with the blackbody radiation curve superimposed on FIG. 11. FIG. 12 is helpful from a graphics standpoint because the various colors are plotted by lines and letters rather than by shaded areas.

In yet another aspect, the invention is a method of forming a high efficiency white emitting semiconductor based lamp. In this aspect, the method comprises forming a cup-shaped dimple into a header to provide electrical contact and a reflective background structure. A high frequency light emitting diode that emits within higher frequencies (e.g. ultraviolet, violet and blue) is positioned in the dimple and electrically connected to an isolated lead.

The dimple cup is then partially filled with a (clear/transparent/suitable) encapsulation material (usually colorless and substantially transparent to most visible frequencies) in an amount sufficient to cover the chip but without filling the cup. The partially filled encapsulation material is cured following which the remainder of the cup is filled with a mixture of the encapsulation material and a phosphor responsive to the frequency produced by the diode. This separates the phosphor from direct contact with the diode and thereby minimizes the diode's absorption of phosphorescent light in operation. The remaining encapsulation material in the cup is cured, following which the three-dimensional geometric solid lens of encapsulation material is formed on the cured material in the cup. The lens material is then cured to form the finished lamp.

As in the device aspects of the invention, the diode placed in the cup preferably includes at least the conductive silicon carbide substrate and at least one active portion of a Group III nitride in a vertical orientation.

The term "vertical" is used herein in its conventional sense with respect to light emitting diodes and means that the ohmic contacts to the device can be placed at opposite ends of the device. The availability of the conductive silicon carbide substrate enables the vertical orientation which is generally more suitable for practical use of light emitting diodes then are the orientations required for similar diodes formed on nonconductive substrates such as sapphire ($Al_2O_3$). When using a non-conductive substrate, the respective ohmic contacts to the p-type and n-type portions of the diode must be positioned in some type of lateral arrangement with respect to one another, thus increasing the diode's footprint. In turn, and in addition to other disadvantages, increasing the footprint decreases the diode's output per unit area.

In order to enhance light extraction, the method aspects of the invention incorporates the etching technique set forth in previously incorporated co-pending and commonly assigned application Ser. No. 10/811,350 which comprises etching the face of the silicon carbide substrate that is opposite to the Group III nitride layer using an aqueous etch to remove damaged portions of the substrate and thereby increase light extraction from the resulting diode and the lamp.

The resin used for the encapsulation in each step is preferably an epoxy resin that has a refractive index greater than 1.0 and more preferably greater than 1.5. As known to those familiar with optics in general and light emitting diodes and lamps in particular, because the lens material has a refractive index greater than air, the lens extracts more light from the diode than would be the case if the diode was in contact with air.

The lens structure can also be modified in the manner set forth in commonly assigned U.S. Pat. No. 6,791,119, the contents of which are incorporated entirely herein by reference.

If desired or necessary, the encapsulant can be mounted in the manner, and formed of a material, described in co-pending and commonly assigned United States Patent Application Publication No. 2004/0227149, the contents of which are incorporated entirely herein by reference.

The diode portion of the lamp according to the present invention can also incorporate the improved current spreading structures set forth in commonly assigned U.S. Pat. No. 6,614,056, the contents of which are incorporated entirely herein by reference.

A key component of the invention is the performance of the blue (455-465 nm) LED chip, whose wall plug efficiency (combination of external quantum efficiency and voltage) has to be high to achieve the white lamp performance stated here. For a 300 μm×300 μm chip operating at 20 mA, typical external quantum efficiency and voltage were 44% and 3.1 V, respectively. For a 900 μm×900 μm chip operating at 350 mA, typical external quantum efficiency and voltage were 31% and 3.2 V, respectively. In both cases, data were for packaged (i.e. encapsulated) chips.

As referred to herein, the wall plug efficiency of an LED is the product of the injection efficiency of the LED (the ratio of the numbers of carriers injected into the device to the number of carriers that recombine in the light-generating region of the device), the radiative efficiency of the LED (the ratio of electron-hole recombinations that result in a radiative event to the total number of electron-hole recombinations), and the extraction efficiency of the LED (the ratio of photons that are extracted from the LED to the total number of photons created). The wall plug efficiency of a device is also defined as the ratio of optical watts out to electrical watts put into the device.

Experimental

An XT290 chip was mounted on a T039 header that was Ag-plated. A cup-shaped dimple had been machined into the header base; the chip was placed in the center of the base of the dimple. After wire bonding to an isolated lead, the cup was partially filled with a clear encapsulation material, which covered the chip but did not fill the cup. OS1600 clear epoxy (from Henkel LocTite Corporation, Rocky Hill Conn.) was used for the encapsulation, its refractive index being approximately 1.5. After a first cure, the remainder of the cup was filled with a mixture of Ce:YAG phosphor (from PhosphorTech Corporation Lithia Springs, Ga. 30122) and OS1600 epoxy, followed by a second cure. The Ce:YAG phosphor concentration was chosen to yield a color-point close to black body curve. Then the header was placed chip-down into a hemispherical mold filled with more OS1600 epoxy, then cured for a third and final time. Finished lamps were characterized in a 10" integrating sphere (Labsphere), which is calibrated to a NIST traceable light source. At a drive current of 20 mA, the luminous flux of the lamps exceeded 5 lumens with an efficacy of 75 lumens per watt or higher.

In a second test, an XB900 chip was mounted on a T039 header that was Ag-plated. A cup shape dimple had been machined into the header base; the chip was placed in the center of the base of the dimple. After wire bonding to an isolated lead, the cup was partially filled with a clear encapsulation material, which covers the chip but does not fill the cup. OS1600 clear epoxy was used for the encapsulation. After a first cure, the remainder of the cup was filled with a mixture of Ce:YAG phosphor and OS1600 epoxy, followed by a second cure. Then the header was placed chip-down into a hemispherical mold filled with more OS1600 epoxy, then cured for a third and final time. The Ce:YAG phosphor concentration was chosen to yield a color-point close to black body curve. Then the header was placed chip-down into a hemispherical mold filled with more OS1600 epoxy, then cured for a third and final time. Finished lamps were characterized in a 10" integrating sphere. At a drive current of 350 mA, the luminous flux of the lamps exceeded 60 lumens with an efficacy of 50 lumens per watt or higher.

In a third test, an XT290 chip was mounted in a standard 5 mm lead-frame cup. Phosphor and encapsulation material were added in a similar manner to the header lamps described above. Following the second cure, the lead-frame was placed in a bullet shaped mold and overmolded with clear encapsulant. The luminous efficacy of such lamps exceeded 75 lumens per watt.

In the drawings and specification there has been set forth preferred embodiments of the invention, and although specific terms have been employed, they are used in a generic and descriptive sense only and not for purposes of limitation, the scope of the invention being defined in the claims.

The invention claimed is:

1. A light emitting solid state lamp comprising:
   a light emitting diode (LED) that emits photons having frequencies selected from the group consisting of the ultraviolet, violet and blue portions of the electromagnetic spectrum, an encapsulant, and a header;
   said LED comprising a Group III nitride active portion for generating desired frequency photons under the application of current across said LED, wherein said LED is vertically oriented;

said header comprising a reflective cup for supporting said LED and for providing electrical contact to said diode LED and to said active portion;
an ohmic contact to said LED with said ohmic contact being in electrical and direct physical contact with said header;
said encapsulant comprising a phosphor, said encapsulant comprising a plurality of portions wherein said phosphor is present in at least one of said portions of said encapsulant that emits responsive frequencies in the yellow portion of the visible spectrum when excited by frequencies emitted from the group consisting of the ultraviolet, violet and blue portions of the electromagnetic spectrum emitted by said LED, wherein a substantially transparent first portion of said encapsulant partially fills said reflective cup and covers said LED and a second portion of said encapsulant comprises said phosphor and is on said first portion.

2. A solid state lamp according to claim 1 with an output of at least 80 lumens per watt at 20 milliamps drive current.

3. A solid state lamp according to claim 1 with an output of at least 85 lumens per watt at 20 milliamps drive current.

4. A solid state lamp according to claim 1 further comprising:
a conductive silicon carbide substrate comprising a single polytype;
at least one p-type Group III nitride layer on said substrate; and
at least one n-type Group III nitride layer on said substrate in a vertical orientation.

5. A solid state lamp according to claim 4 wherein said ohmic contact is in contact with one of said Group III nitride layers.

6. A solid state lamp according to claim 1 wherein said reflective cup includes a silver coating for maximizing light extraction from said lamp.

7. A solid state lamp according to claim 1 wherein said encapsulant comprises an epoxy resin.

8. A solid state lamp according to claim 1 wherein said phosphor comprises cerium yttrium aluminum garnet.

9. A solid state lamp according to claim 1 comprising at least one p-type Group III nitride layer and an ohmic contact to said p-type layer, said ohmic contact having an average thickness of between about 1 and 250 A.

10. A solid state lamp according to claim 9 wherein said ohmic contact has an average thickness of between about 1 and 10 A.

11. A lamp according to claim 1 wherein said LED has a total dimension between and including any ohmic contacts of no more than 250 µm.

12. A lamp according to claim 1 wherein said LED has a total dimension between and including any ohmic contacts of no more than 100 µm.

13. A light emitting solid state lamp comprising:
a light emitting LED that emits photons having frequencies selected from the group consisting of the ultraviolet, violet and blue portions of the electromagnetic spectrum, an encapsulant, and a header;
said LED comprising a conductive substrate for electrical contact and is vertically oriented;
a Group III nitride active portion on said substrate for generating desired frequency photons under the application of current across said LED;
said header comprising a reflective cup for supporting said LED and for providing electrical contact to said LED and to said active portion, said header in direct contact with said LED:
said encapsulant comprising a phosphor, said encapsulant comprising at least a first portion and a second portion wherein said phosphor is present in at least one of said portions of said encapsulant that emits responsive frequencies in the yellow portion of the visible spectrum when excited by frequencies emitted from the group consisting of the ultraviolet, violet and blue portions of the electromagnetic spectrum emitted by said LED, wherein said first portion is substantially transparent, partially fills said reflective cup, and covers said LED, and said second portion comprises said phosphor and is on said first portion.

14. A light emitting solid state lamp according to claim 13 wherein said Group III nitride active portion includes at least one p-type and one n-type layer on said substrate for generating desired frequency photons under the application of current across said LED; and
said p-type layer is positioned adjacent said header.

15. A light emitting solid state lamp according to claim 13 wherein said substrate includes light extraction features.

16. A solid state lamp according to claim 1 with an output of at least 75 lumens per watt at 20 milliamps drive current within a ccx of 0.32-0.37 and a ccy of 0.31-0.39 on the CIE diagram.

17. A light emitting solid state lamp according to claim 13 with an output of at least 75 lumens per watt at 20 milliamps drive current within a ccx of 0.32-0.37 and a ccy of 0.31-0.39 on the CIE diagram.

18. A solid state lamp according to claim 1, wherein said LED is at least 900 µm×900 µm, with a quantum efficiency of at least 31% when operating at no more than 350 mA.

19. A solid state lamp according to claim 1, wherein said LED is at least 300 µm×300 µm, with a quantum efficiency of at least 44% when operating at no more than 20 mA.

20. A light emitting solid state lamp according to claim 13, wherein said LED is at least 900 µm×900 µm, with a quantum efficiency of at least 31% when operating at no more than 350 mA.

21. A light emitting solid state lamp according to claim 13, wherein said LED is at least 300 µm×300 µm, with a quantum efficiency of at least 44% when operating at no more than 20 mA.

22. A solid state lamp according to claim 1, wherein the reflective cup comprises a functional shape that maximizes an extraction of light from the LED.

23. A solid state lamp according to claim 1, wherein the reflective cup comprises a frustoconical shape.

24. A solid state lamp according to claim 23, wherein the frustoconical shape comprises the reflective cup including a floor facing a parallel and larger opening and a slanted wall between the floor and the opening.

25. A light emitting solid state lamp according to claim 13, wherein the reflective cup comprises a functional shape that maximizes an extraction of light from the LED.

26. A light emitting solid state lamp according to claim 13, wherein the reflective cup comprises a frustoconical shape.

27. A light emitting solid state lamp according to claim 26, wherein the frustoconical shape comprises the reflective cup including a floor facing a parallel and larger opening and a slanted wall between the floor and the opening.

* * * * *